United States Patent [19]

Oka et al.

[11] Patent Number: 4,956,334

[45] Date of Patent: Sep. 11, 1990

[54] METHOD FOR PREPARING A SINGLE CRYSTAL OF LANTHANUM CUPRATE

[75] Inventors: Kunihiko Oka; Hiromi Unoki, both of Tsukuba, Japan

[73] Assignee: Agency of Industrial Science and Technology, Tokyo, Japan

[21] Appl. No.: 168,021

[22] Filed: Mar. 14, 1988

[30] Foreign Application Priority Data

May 1, 1987 [JP] Japan ................................ 62-109517
May 1, 1987 [JP] Japan ................................ 62-109518
May 1, 1987 [JP] Japan ................................ 62-109519

[51] Int. Cl.$^5$ .............................................. C30B 15/30
[52] U.S. Cl. ..................................... 505/1; 505/729; 156/617.1; 156/618.1; 156/619.1; 156/DIG. 76; 423/593
[58] Field of Search .......... 156/617.1, 618.1, DIG. 76, 156/DIG. 11; 423/593; 505/717, 729

[56] References Cited

U.S. PATENT DOCUMENTS 3,994,690 11/1976 Defosse ............................ 156/617.1
4,235,848 11/1980 Sokolov et al. ................... 156/617.1

OTHER PUBLICATIONS

Holland et al., Interplay of Synthesis, Structure, Microstructure, and Superconducting Properties of YBa$_2$Cu$_3$O$_7$ Amer. Chem. Soc. 8/30–9/14, 1987.
Bykov et al., Crystallization of High Temperature Superconductors from Nonstoichometric Melts, Journal of Crystal Growth vol. 91 (1985) pp. 302–307.
Chen et al., The Flux Growth of Crystals of (La,Sr)$_2$CuO$_4$ and (La,Sr)CuO$_3$, Solid State Comunications, vol. 66, No. 6, pp. 611–612 1988.
Aselage et al., Preparation and Properties of High T$_c$ Superconducting Ceramics, Extended Abs, High Temp. Superconductors (M.R.S.) 4/23–24/87 pp. 157–159.
Pamplin, "Crystal Growth", Pergamon Press, New York, 1980 pp. 6 to 7.
Morris et al., Preparation of High-Quality, Single Crystals of 90K Superconducting YBa$_2$Cu$_3$O, Extended Abs., High Temp. Superconductor II, (M.R.S.) 4/5–9/88 pp. 43 to 46.
Jiang et al., Crystal Growth of Y-Ba-Cu-O Compound by Laser Floating Zone Melting Extend Abs, High Temp. Superconductors (II), (M.R.S.) 4/5–9/88 pp. 125 to 128.
Inoue et al., Growth of (La$_{1-x}$Sr$_x$)$_2$CuO$_{4-\delta}$ Crystals from High Temperature Solution Japanese Journal of Applied Physics, vol. 26, No. 5, May 1987, pp. L732–L733.
Kawabe et al., Single Crystal Growth of Superconducting Layered Perovskite Metal Oxides, Presented at M.R.S. Conference 4/87, pp. 251 to 252.
Y. Hidaka et al.; J. Appl. Phys., 26, L 377 (1987).
Journal of Crystal Growth, vol. 85, No. 4, Dec. 1987, pp. 581–584, Y. Hidaka et al: "Single Crystal Growth of (La$_{1-x}$A$_x$)$_2$CuO$_4$(A=Ba or Sr) and Ba$_2$YCu$_3$O$_{7-y}$".
Japanese Journal of Applied Physics, vol. 26, No.5, part 2, May 1987, page L 673; H. Hasegawa et al: "Single Crystal Growth of Layered Perovskite Metal Oxides".
Japanese Journal of Applied Physics, vol. 23, No. 8, part 1, pp. 1143–1144 Tokyo JP: T. Matsuura et al: "Single Crystal Growth of La$_{2-x}$Sr$_x$CoO$_4$ (x=1.0, 0.5, and 1.5)".

Primary Examiner—Gary P. Straub
Assistant Examiner—Robert M. Kunemund
Attorney, Agent, or Firm—Armstrong, Nikaido, Marmelstein, Kubovcik & Murray

[57] ABSTRACT

Lanthanum cuprate, La$_2$CuO$_4$, is a superconductive oxide. In order to prepare a single crystal of lanthanum cuprate, the phase diagram of La$_2$O$_3$-CuO system is determined utilizing their differential thermal analysis and X-ray diffractometry. Cu oxide and at least one of lanthanum oxide and lanthanum carbonate are mixed in the molar ratio of 71.1-92.9:28.9-7.1. The resulting mixture is heated to be molten. While slowly cooling the melt, nuclei of La$_2$CuO$_4$ precipitate from the melt, growing to single crystals in the melt. As a result, large scale single crystals are prepared.

5 Claims, 3 Drawing Sheets

METHOD FOR PREPARING A SINGLE CRYSTAL OF LANTHANUM CUPRATE

BACKGROUND OF THE INVENTION

1. Field of the Invention

The present invention relates to a method for preparing a single crystal of lanthanum cuprate.

1. Description of the Prior Art

Lanthanum cuprate ($La_2CuO_4$) is an oxide having a potassium nickel fluoride ($K_2NiF_4$) type structure and exhibits superconductivity at a low temperature when a part of La atoms is substituted by Ba or Sr atoms. The transition temperature thereof is within the range from 30° to 40° K and thus a variety of applications to devices operating at a very low temperature will be conceivable for the future. For this reason, it has been required to prepare single crystals having a large scale and exhibiting a good quality as well as to develop a method for preparing such a single crystal.

A photograph of such a crystal having a size of the order of $5 \times 5 \times 1$ mm grown by a conventional method has been published (Y. Hidaka et al.; J. Appl. Phys., 26, L377 (1987)), however, the details of the process has not been published.

Heretofore, the flux method has been employed to obtain single crystals of a material which decomposes at high temperature and cause peritectic reaction during cooling and thus cannot provide single crystals thereof by a usual pulling method (Czochralski method). The flux method in general comprises the steps of mixing an objective material with a flux, melting the mixture thus obtained, slowly cooling the molten mixture to bring it into a supersaturated state and thus to crystallize single crystals of an objective material from the melt. In this connection, the kind of flux for crystallizing the objective single crystal and the amount thereof to be added to the objective material as well as the temperature range for the growth of the single crystal must be made clear in order to grow with certainty single crystals by the flux method. For that purpose, it is needed to obtain a phase diagram of a system composed of a raw material and a flux.

SUMMARY OF THE INVENTION

Accordingly, it is an object of the present invention to provide a method for preparing a large scale single crystal of lanthanum cuprate having a good quality within a short period of time.

In the first aspect of the present invention, a method for preparing a single crystal of lanthanum cuprate comprises the steps of:

mixing 28.9 to 7.1 mole % of at least one of lanthanum oxide and lanthanum carbonate and 71.1 to 92.9 mole % of copper oxide, heating the mixture at a temperature of 1040 to 1330° C. so that the mixture is melted; and slowly cooling the resultant melt to grow a single crystal of a lanthanum cuprate having a composition represented by the formula $La_2CuO_4$ from the melt.

Here, the lanthanum cuprate may include a small amount of a foreign element.

The foreign element may be barium or strontium.

In the second aspect of the present invention, a method for preparing a single crystal of lanthanum cuprate comprises the steps of:

mixing 28.9 to 7.1 mole % of at least one of lanthanum oxide and lanthanum carbonate and 71.1 to 92.9 mole % of copper oxide;

heating the mixture to form a melt;

contacting a seed crystal to the melt; and slowly cooling the melt and pulling the seed crystal so that a crystallite deposits on the seed crystal and a single crystal of lanthanum cuprate having a composition represented by the formula $La_2CuO_4$ grows from the crystallite.

Here, the lanthanum cuprate may include a small amount of a foreign element.

The foreign element may be barium or strontium

The cooling may be effected at a rate in the range of from 0.5 to 10°/h.

In the third aspect of the present invention, a method for preparing a single crystal of lanthanum cuprate comprises the steps of:

placing a flux composed of 28.9 to 7.1 mole % of at least one of lanthanum oxide and lanthanum carbonate and 71.1 to 92.9 mole % of copper oxide between a raw material rod of lanthanum cuprate and a seed crystal;

heating the flux at a temperature of 1040 to 1330° C. so that the flux melts and forms a floating zone;

relatively moving the floating zone and the raw material rod in the direction of the raw material rod so that as passing the floating zone, the raw material rod melts, crystallizes and grows to a single crystal on the seed crystal.

Here, the lanthanum cuprate may include a small amount of a foreign element

The foreign element may be barium or strontium.

The rate of relative movement of the floating zone and the rod of starting material may be in the range of from 0.2 to 2 mm/h.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 1:
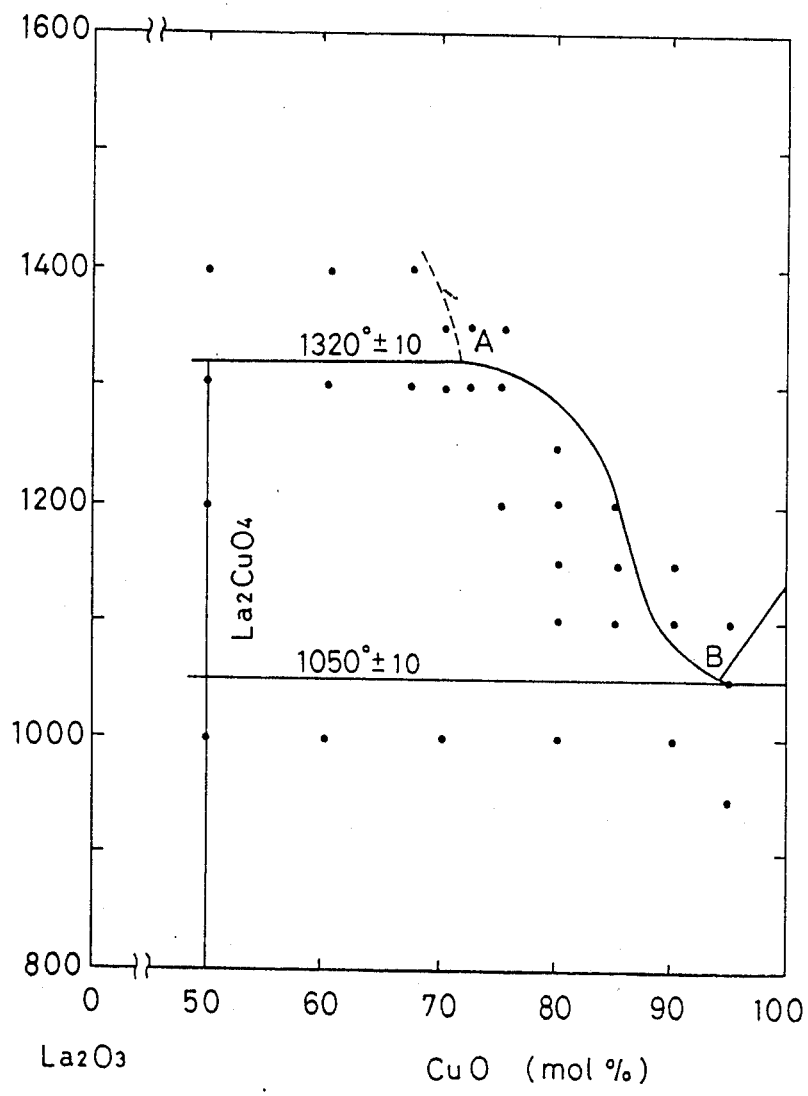
FIG. 1 is a phase diagram of the $La_2O_3$-CuO system showing the mixing ratio of $La_2O_3$ and CuO, and allowing the growth of a single crystal of lanthanum cuprate.

FIG. 1 shows a phase diagram of the $La_2O_3$-CuO system prepared by the inventors of the present invention.

A variety of samples having different composition ratios between $La_2O_3$ and CuO are prepared, then the changes of phase of the samples are observed by means of differential thermal analysis and also the compositions of the quenched samples are measured by means of X-ray diffractometry. The values measured are indicated by black dots in FIG. 1. The phase diagram is obtained from a comprehensive judgment on the basis of the results mentioned above.

As is obvious from the results shown in FIG. 1, it is conceived that the single crystal of $La_2CuO_4$ precipitates from a melt having a composition range corresponding to the liquidus line AB, in which the melt comprises 28.9 to 7.1 mole % of $La_2O_3$ and 71.1 to 92.9 mole % of CuO, and at a temperature in the range from 1330° to 1040° C. In other words, if the melt having a composition falling within the foregoing range is slowly cooled, the composition of the melt shifts towards the CuO side along the liquidus line AB, seeds of $La_2CuO_4$ crystal precipitate from the melt as a solid phase and grow during the cooling of the melt.

If the composition of the melt is at the CuO side from the eutectic point B, CuO is the first precipitate from the melt upon cooling, while if the composition of the melt is at the $La_2O_3$ side from the point A, a crystal having a composition corresponding to that at the $La_2O_3$ side first precipitates from the melt upon cooling the melt. In either case, the crystal of $La_2CuO_4$ cannot precipitate the melt and cannot also grow.

A single crystal of $La_2CuO_4$ solid solution, in which a part of La atoms and/or Cu atoms is substituted by atoms of a foreign element, can be prepared by the method similar to that explained above, so far as the phase diagram of the system composed of $La_2O_3$, CuO and the foreign element does not substantially differ from that of $La_2O_3$-CuO system. That is, the above-mentioned single crystal of $La_2CuO_4$ solid solution can be prepared by mixing the foreign element into the melt. For instance, a single crystal of $La_2CuO_4$ solid solution, in which a small amount of the foreign element such as Sr, Ba and the like are mixed, can be prepared.

A method for growing a single crystal of $La_2CuO_4$ will now be explained on the basis of the phase diagram shown in FIG. 1. The single crystal of $La_2CuO_4$ system was prepared by the flux method, the pulling method and the floating zone method.

Example 1

First of all, the method for preparing the single crystal of $La_2CuO_4$ system by the flux method according to the present invention will hereunder be explained in more detail.

A single crystal of $La_2CuO_4$ was prepared by the flux method.

$La_2O_3$ and CuO were mixed with one another in a molar ratio of 20:80. 100 g of the resulting mixture was charged into a crucible made of platinum (diameter=50 mm; height=40 mm), the crucible was sealed with a cover made of alumina, these were further put in a crucible made of alumina and the resultant assembly was further put into a refractory box with a lid. Thus, the mixture was triply sealed for the purpose of preventing the loss of copper oxide due to evaporation. Then, the refractory box was put into a muffle furnace, heated to about 1350° C. and maintained for 2 hours, and then the temperature of the assembly was cooled to 1050° C. at a rate of about 8° C./h, followed by cooling down to room temperature at a rate of 200° C./h. As a result, a single crystal of $La_2CuO_4$ having a size of $8 \times 8 \times 2$ mm was obtained in the solidified flux.

Example 2

A single crystal of solid solution having a composition represented by the formula $(La_{0.9}Ba_{0.1})_2CuO_4$ was prepared by the flux method.

A mixture composed of 90 mole % of $La_2O_3$ and 10 mole % of $2BaCO_3$ and CuO was prepared, so that the molar ratio of $(La_2O_3 + 2BaCO_3)$ to CuO became 20:80. Then, the resultant mixture was treated in the same manner as explained in Example 1. As a result, a single crystal of $(La_{0.9}Ba_{0.1})_2CuO_4$ solid solution having a size of $8 \times 8 \times 1$ mm was obtained in the solidified flux.

Example 3

A single crystal of a solid solution having a composition represented by the formula $(La_{0.9}Sr_{0.1})_2CuO_4$ was obtained by the flux method.

A mixture composed of 90 mole % of $La_2O_3$ and 10 mole % of $2SrCO_3$ and CuO was prepared in a molar ratio of 20:80. Then, the resultant mixture was treated in the same manner as explained in Example 1. As a result, a single crystal of $(La_{0.9}Sr_{0.1})_2CuO_4$ solid solution having a size of $2 \times 4 \times 0.5$ mm was obtained in the solidified flux.

In Examples 2 and 3, part of the La lattice sites were substituted by atoms of the foreign element (Ba or Sr). This means that if the phase diagram of a system including a small amount of foreign elements is substantially identical with that observed in the $La_2O_3$-CuO system shown in FIG. 1, it is possible to produce a single crystal of $La_2CuO_4$ solid solution, which includes a foreign element, by incorporating such a foreign element into the starting mixture. Likewise, if a small amount of such a foreign element that copper atoms are substituted by atoms of the element is included, so far as the phase diagram of the system is substantially identical with that shown in FIG. 1, it is also possible to prepare a single crystal of $La_2CuO_4$ solid solution including the foreign elements.

For preparing single crystals of $La_2CuO_4$, lanthanum carbonate $(La_2(CO_3)_3)$ may also be used as a starting material in place of lanthanum oxide $(La_2O_3)$. $La_2(CO_3)_3$ undergoes the following reaction during heating:

$$La_2(CO_3)_3 \rightarrow La_2O_3 + 3CO_2 \uparrow$$

and thus is converted to $La_2O_3$. This clearly means that even if $La_2(CO_3)_3$ and CuO are used as starting materials, the same phase diagram as shown in FIG. 1 is obtained. Thus, according to the procedures similar to those explained in the foregoing Examples, single crystals of $La_2CuO_4$ and those of oxides in which La atoms were partially substituted by Ba or Sr atoms were likewise obtained by utilizing lanthanum carbonate as the starting material.

Example 4

The growth of single crystals by the pulling method will now described below. Contrary to the flux method, this pulling method, in which a seed crystal is employed, makes it possible to prepare a single crystal having a desired orientation, any size and good quality within a short period of time.

A single crystal of $La_2CuO_4$ was prepared by the pulling method.

Figure 2:
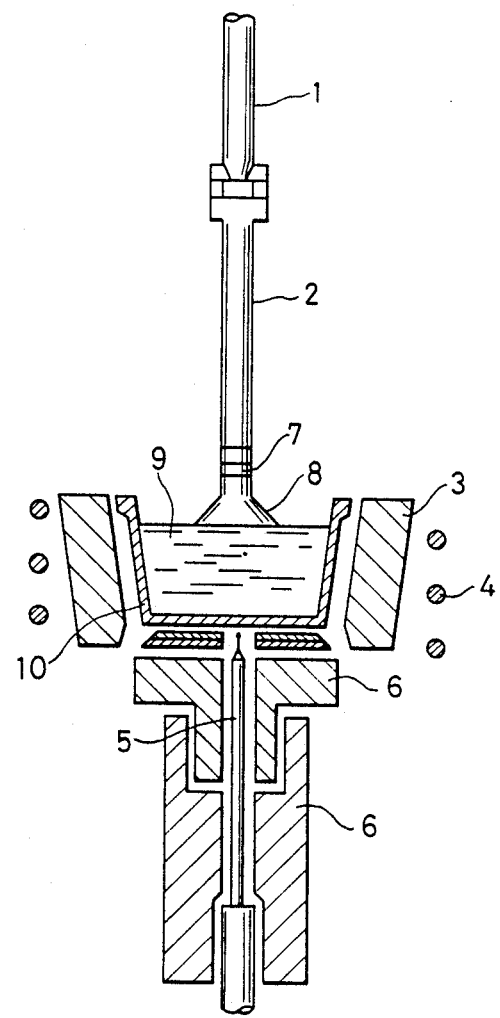
FIG. 2 is a sectional view of an apparatus for preparing single crystals in accordance with the present invention.

An apparatus for producing a single crystal by the pulling method according to the present invention is shown in FIG. 2 as a sectional view.

In FIG. 2, the reference numeral 1 means a water cooled shaft; 2 a shaft of platinum; 3 a heat insulating material; 4 an RF heating coil; 5 a thermocouple; 6 a support member for crucible; 7 a seed crystal; 8 a growing single crystal; 9 starting materials; and 10 a crucible of platinum, respectively.

$La_2O_3$ and CuO were mixed in a molar ratio of 15:85. 200 g of the mixture was charged into a crucible 10 made of platinum (inner diameter=50 mm; height=35 mm), the crucible 10 serves as a heating element. The mixture was heated to about 1200° C. by the induction heating system by the use of RF heating coil 4 to form a melt of the mixture. And then a seed crystal, i.e., a single crystal 7 of $La_2CuO_4$ was brought into contact with the surface of the melt. Upon slowly lowering the temperature of the melt, $La_2CuO_4$ precipitated as fine crystallites from the melt at the interface, which had the lowest temperature in the melt, between the melt and the seed crystal and the fine crystallites crystallized and grew on the seed crystal 7. The single crystal 8 thus grown was slowly pulled from the melt. In other words, the growing crystal was pulled while the temperature of the melt was lowered. In this connection, the single crystal 8 was pulled at a rate of 0.3 to 1 mm/h, the temperature of the melt was reduced at a rate of 0.5 to 10° C./h, and the number of rotation of the crystal was from 10 to 30 rpm. In this Example, the crystal growth was effected by the air. The time required to obtain a single crystal of $La_2CuO_4$ having a size of $9\times7\times4$ mm and a weight of 1 g was only 9 to 10 hours. The growth of the single crystal may also be possible in an oxygen atmosphere.

Example 5

A single crystal of a solid solution having a composition represented by the formula $(La_{0.9}Ba_{0.1})_2CuO_4$ was prepared by the pulling method. A starting mixture was obtained by mixing a mixture composed of 90 mole % of $La_2O_3$ and 10 mole % of $2BaCO_3$ with CuO in a molar ratio of 15:85 and the resulting mixture was treated by the same procedures as Example 4. As a result, a single crystal of $(La_{0.9}Ba_{0.1})_2CuO_4$ solid solution having a size of $8\times7\times3$ mm was obtained. The single crystal of $(La_{0.9}Ba_{0.1})_2CuO_4$, in which part of La atoms in the crystal were substituted by Ba atoms, could be prepared by the pulling method according to the present invention, because the phase diagram of $(La_{0.9}Ba_{0.1})_2O_3$-CuO system does not substantially differ from that of $La_2O_3$-CuO system shown in FIG. 1.

So far as the phase diagram of the system including any of a foreign element does not differ from that of $La_2O_3$-CuO system shown in FIG. 1, it is also possible to prepare a single crystal of $La_2CuO_4$ solid solution, in which a part of La atoms and/or Cu atoms in the crystal are substituted by atoms of the foreign element, in the same manner and conditions described above.

In the pulling method, lanthanum carbonate ($La_2(CO_3)_3$) may also be used as a starting material in place of lanthanum oxide ($La_2O_3$) as in the case of the flux method.

Example 6

The method for preparing a single crystal by the floating zone method according to the present invention will hereunder be explained in more detail. The floating zone method makes it possible to cut down the expenses of starting materials since this method allows for most of the starting materials to convert to a single crystal.

A single crystal of $La_2CuO_4$ was prepared by the floating zone method.

Figure 3:
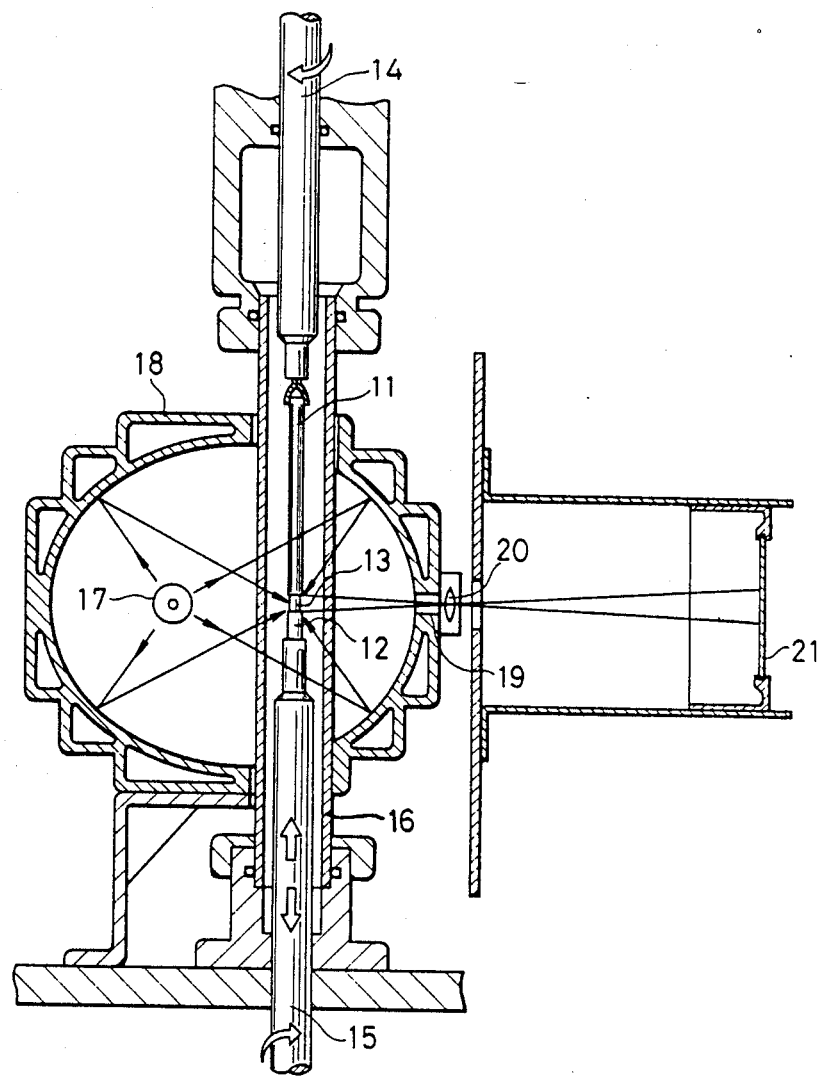
FIG. 3 is a sectional view of another apparatus for preparing single crystals in accordance with the present invention.

An apparatus for preparing single crystals by the floating zone method is depicted in FIG. 3 as a sectional view.

In FIG. 3, the reference numeral 11 represents a rod of the starting material (raw rod); 12 a seed crystal; 13 melting zone (solvent); 14 and 15 rotating shafts; 16 a quartz tube; 17 a halogen lamp; 18 a rotating ellipsoidal mirror; 19 a window for monitoring; 20 a lens; and 21 a screen for monitoring.

The rod 11 of the starting material, $La_2CuO_4$, was prepared by mixing powders of $La_2O_3$ and CuO in a molar ratio of 1:1, calcining the mixed powder at 900° C. for 2 hours, forming the calcined powder into a material of round rod-like shape having a diameter of 6 mm and a length of 7 cm utilizing a pressure molding device and then uniformly sintering the molded rod at 950° C. for 2 hours.

Similarly, a raw material for flux was prepared by calcining powder of a mixture composed of 15 mole % of $La_2O_3$ and 85 mole % of CuO at 900° C. for 2 hours, then forming the calcined powder into a round rod-like material having a diameter of 6 mm according to the pressure molding technique, and uniformly sintering the rod-like material at 950° C. for 2 hours. Thereafter, the round rod-like material for flux was cut into disc-like pieces having a weight of 0.5 to 0.9 g and the resultant disc-like piece was fused to the raw material rod for $La_2CuO_4$ single crystal.

The cylindrical rod-like sample composed of the raw material rod of $La_2CuO_4$ and the flux 13 fused to the top of the rod was fixed on the upper rotating shaft 14 for rotating the sample, while a seed crystal 12 was fixed at the lower rotating shaft 15. The seed crystal 12 and the raw material rod 11 of $La_2CuO_4$ to which the flux 13 has been fusion bonded were disposed to the corresponding rotating shafts so as to be co-axial with respect to the shafts, respectively The apparatus for preparing the signal crystal is provided with an infrared-ray heating system. The flux was heated by irradiating it with infrared rays from the halogen lamp 17 and was melted, thereafter the seed crystal was brought into contact with the molten flux, so that the molten flux was supported between the raw material rod and the seed crystal due to the action of surface tension of the melt.

Then, the raw material rod and the seed crystal were rotated in opposite directions at a rate of 30 rpm.

Further, the rotating shafts 14 and 15 were moved in the downward (or in the upward) direction, in other words, the molten flux was moved relative to the raw material rod in the upward (or in the downward) direction at a rate of 0.2 to 2 mm/h, so as to grow a single crystal of $La_2CuO_4$ on the seed crystal. The growth of the single crystal was effected in the air and in the oxygen atmosphere of 1 atm., however, the loss of CuO or the like was negligible since the evaporated amount thereof was very small and thus there was no problem.

When the raw material rod was almost consumed, the grown crystal and the raw material rod were cut off from one another and were cooled to room temperature. Thus, there was obtained a cylindrical rod-like single crystal of $La_2CuO_4$ having a diameter of 5 mm and a length of 5 mm.

Example 7

A single crystal of a solid solution having a composition represented by the formula $(La_{0.9}Ba_{0.1})_2CuO_4$ was prepared by the floating zone method.

A mixture having the composition of 90 mole % of $La_2O_3$ and 10 mole % of $2BaCO_3$ and CuO was mixed, so that molar ratio of $(La_2O_3+2BaCO_3)$ to CuO became 1:1 and 15:85, respectively. The raw material rod and the flux were prepared from these mixtures. Then the procedure explained in Example 6 was repeated. As a result, the single crystal of $(La_{0.9}Ba_{0.1})_2CuO_4$ solid solution having a diameter of 5 mm and a length of 8 mm was obtained.

The single crystal of $(La_{0.9}Ba_{0.1})_2CuO_4$, in which part of La atoms in the crystal was substituted by Ba atoms, could be prepared by the floating zone method according to the present invention, because the phase diagram of $(La_{0.9}Ba_{0.1})_2O_3$-CuO system does not substantially differ from that of $La_2O_3$-CuO system shown in FIG. 1.

So far as the phase diagram of the system including any of a foreign element does not differ from that of $La_2O_3$-CuO system shown in FIG. 1, it is also possible to prepare a single crystal of $La_2CuO_4$ solid solution, in which a part of La atoms and/or Cu atoms in the crystal is substituted by atoms of the foreign element, in the same manner and conditions described above.

In the floating zone method, lanthanum carbonate $(La_2(CO_3)_3)$ may also be used as a starting material in place of lanthanum oxide $(La_2O_3)$ as in the case of the flux method.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A method for preparing a single crystal of lanthanum cuprate comprising the steps of:
    mixing 28.9 to 7.1 mole % of at least one of lanthanum oxide and lanthanum carbonate and 71.1 to 92.9 mole % of copper oxide;
    heating the mixture to form a melt;
    contacting a seed crystal to said melt; and
    slowly cooling said melt and pulling said seed crystal so that a crystallite deposits on said seed crystal and a single crystal of lanthanum cuprate having a composition represented by the formula $La_2CuO_4$ grows from said crystallite.

2. A method for preparing a single crystal of lanthanum cuprate as claimed in claim 1, wherein said lanthanum cuprate includes a small amount of a foreign element.

3. A method for preparing a single crystal of lanthanum cuprate as claimed in claim 2, wherein said foreign element is barium or strontium.

4. A method for preparing single crystal of lanthanum cuprate as claimed in claim 1, wherein said cooling is effected at a rate in the range of from 0.5° to 10°/h.

5. A method for preparing a single crystal of lanthanum cuprate as claimed in claim 4, wherein the rate of said pulling of said seed crystal in the range from 0.3 to 1 mm/h, and said seed crystal is rotated at a rate in a range from 10 to 30 rpm during said pulling.

* * * * *